(12) United States Patent
Huang et al.

(10) Patent No.: US 8,288,844 B2
(45) Date of Patent: Oct. 16, 2012

(54) INTEGRATED CIRCUIT PACKAGING SYSTEM WITH PACKAGE STACKING AND METHOD OF MANUFACTURE THEREOF

(75) Inventors: Rui Huang, Singapore (SG); Seng Guan Chow, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 361 days.

(21) Appl. No.: 12/641,319

(22) Filed: Dec. 17, 2009

(65) Prior Publication Data

US 2011/0147901 A1   Jun. 23, 2011

(51) Int. Cl.
*H01L 23/552* (2006.01)
*H01L 21/98* (2006.01)

(52) U.S. Cl. ......... 257/660; 257/E23.114; 257/E23.123; 438/109

(58) Field of Classification Search .................. 257/659, 257/660
See application file for complete search history.

(56) References Cited

U.S. PATENT DOCUMENTS

| | | | |
|---|---|---|---|
| 6,498,381 B2 | 12/2002 | Halahan et al. | |
| 7,595,209 B1 | 9/2009 | Monadgemi et al. | |
| 7,605,417 B2 | 10/2009 | Drewes | |
| 7,618,846 B1 | 11/2009 | Pagaila et al. | |
| 7,622,793 B2 | 11/2009 | Anderson | |
| 2010/0244208 A1* | 9/2010 | Pagaila et al. | 257/659 |

OTHER PUBLICATIONS

U.S. Appl. No. 12/404,069, filed Mar. 13, 2008, Pagaila et al.

* cited by examiner

*Primary Examiner* — Ha Tran T Nguyen
*Assistant Examiner* — Raj R Gupta
(74) *Attorney, Agent, or Firm* — Ishimaru & Associates LLP; Mikio Ishimaru; Stanley M. Chang

(57) ABSTRACT

A method of manufacture of an integrated circuit packaging system includes forming a lead frame including providing a tie bar plate, forming conductive columns on the tie bar plate, forming a dielectric layer on the conductive columns, applying a conductive shield layer on the dielectric layer, and exposing the conductive columns through the dielectric layer and the conductive shield layer; forming a base package substrate; mounting a base integrated circuit die on the base package substrate; mounting the tie bar plate, over the base integrated circuit die, conductively coupled to the base package substrate to form the conductive shield layer into an electro-magnetic interference shield; and removing the tie bar plate to expose the conductive columns from the dielectric layer.

20 Claims, 4 Drawing Sheets

INTEGRATED CIRCUIT PACKAGING SYSTEM WITH PACKAGE STACKING AND METHOD OF MANUFACTURE THEREOF

TECHNICAL FIELD

The present invention relates generally to an integrated circuit packaging system, and more particularly to a system for stacking integrated circuit packages.

BACKGROUND ART

The electronic industry continues to seek products that are lighter, faster, smaller, multi-functional, more reliable and more cost-effective. The advent of multi-function electronic devices, such as cell phones that are also game platforms, cameras, Internet portals, and music or video players, has brought immense pressure on the electronics device manufacturers and the manufacturing companies that support them.

In an effort to meet such requirements, package assembly techniques have been developed for multi-chip packages (MCP) and chip stack packages. These types of packages combine two or more semiconductor chips in a single package, thereby realizing increased memory density, multi-functionality and/or reduced package footprint.

The use of several chips in a single package does, however, tend to reduce both reliability and yield. During post assembly testing, if just one chip in the multi-chip or chip stack package fails to meet the functional or performance specifications, the entire package fails, causing the good chip(s) to be discarded along with the failing chip. As a result, multi-chip and chip stack package tend to lower the productivity from the assembly process.

A 3-dimensional package stack addresses this yield problem by stacking several assembled packages that each contain a single chip and that have already passed the necessary tests, thereby improving the yield and reliability of the final composite package. As the complexity of the functions in the stacked integrated circuit packages increases, the number of interconnected signals increases also. This problem is increased by the reduction in package size which the interconnected signals to be compressed in smaller and smaller spaces.

Attempts to form area array type packages have met with other difficulties. Positioning of the contacts within the array and alignment between the two stacked interfaces has proved a daunting problem. The close proximity of the signal interconnects and the frequency of the signal transitions may create cross-talk and signal integrity problems. Also the shrinking of the package size may bring the integrated circuit die in the stacked packages into close proximity, which may have detrimental effects on the function of the integrated circuit die due to radiated electro-magnetic noise.

Thus, a need still remains for an integrated circuit packaging system with package stacking, in order to meet the volume and performance needs of the electronic devices industry. In view of the ever-growing demand for smaller devices with more function, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system includes: forming a lead frame including providing a tie bar plate, forming conductive columns on the tie bar plate, forming a dielectric layer on the conductive columns, applying a conductive shield layer on the dielectric layer, and exposing the conductive columns through the dielectric layer and the conductive shield layer; forming a base package substrate; mounting a base integrated circuit die on the base package substrate; mounting the tie bar plate, over the base integrated circuit die, conductively coupled to the base package substrate to form the conductive shield layer into an electro-magnetic interference shield; and removing the tie bar plate to expose the conductive columns from the dielectric layer.

The present invention provides an integrated circuit packaging including: a base package substrate; a base integrated circuit die coupled to the base package substrate; an electro-magnetic interference shield over the base integrated circuit die; and an array of conductive columns coupled to the base package substrate and exposed through the electro-magnetic interference shield includes the electro-magnetic interference shield between each of the conductive columns.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
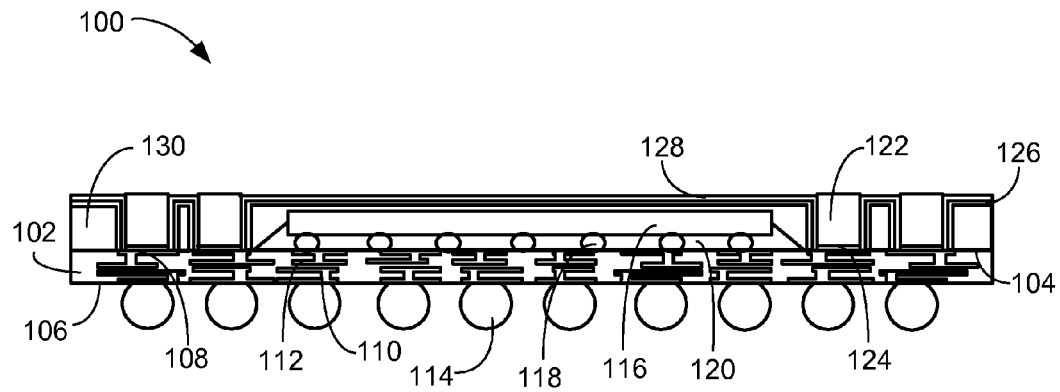
FIG. 1 is a cross-sectional view of an integrated circuit packaging system with package stacking in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, each having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means there is direct contact between elements with no intervening material.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit packaging system 100 with package stacking in a first embodiment of the present invention. The cross-sectional view of the integrated circuit packaging system 100 depicts a base package substrate 102 having a component side 104 and a system side 106. Component pads 108 on the component side 104 may be coupled to system pads 110 on the system side 106 by internal wiring 112, such as traces, vias, or a combination thereof. System interconnects 114, such as solder bumps, solder balls, solder columns, or stud bumps, may be formed on the system pads 110 in order to couple to the next level system, not shown.

A base integrated circuit die 116 may be coupled to the component pad 108 by chip interconnects 118, such as solder bumps, solder balls, or bond wires. A sealing adhesive 120, such as an underfill material or a die attach material, may be applied between the component side 104 and the base integrated circuit die 116 to enclose the chip interconnects 118 in order to protect them from moisture or fracture due to shock.

The base integrated circuit die 116 is shown as a flip chip die, but this is an example only and other die configurations are possible. In other configurations of the base integrated circuit die 116, such as a wire bonding integrated circuit die, the sealing adhesive 120 may be a die attach material.

Conductive columns 122 may be attached to the component pads 108 by a conductive adhesive 124, such as solder or conductive epoxy. The conductive columns 122 may contact a conductive shield layer 126, such as a copper (Cu) layer or aluminum (Al) layer, deposited on a dielectric layer 128. The dielectric layer 128 is on and directly contacting the conductive columns 122. The dielectric layer 128 may be applied on the conductive columns 122 by conformal coating, chemical vapor deposition, or the like. A package body 130, such as an epoxy molding compound, may be formed between the component side 104 and a non-horizontal portion of the conductive shield layer 126 to completely enclose the base integrated circuit die 116. The non-horizontal portion of the conductive shield layer 126 can be between the base integrated circuit die 116 and the conductive columns 122.

It has been discovered that the conductive shield layer 126 may provide an electro-magnetic interference (EMI) shield for the base integrated circuit die 116 as well as an isolation barrier between the conductive columns 122 when the conductive shield layer 126 is coupled to a reference voltage. While the conductive columns 122 are shown in pairs on either side of the base integrated circuit die 116, this is an example only and a different number of the conductive columns 122 may be implemented. It has been further discovered that the dielectric layer 128 may simplify the manufacturing process by resisting solder shorts between adjacent rows of the conductive columns 122, since the dielectric layer is not solder wettable.

It has been further discovered that a voltage reference, such as a ground reference, may be applied to the conductive shield layer 126, by patterning the dielectric layer 128 to provide an opening on certain of the conductive columns 122. By providing a voltage reference to the conductive shield layer 126, an electro-magnetic interference (EMI) shield may be provided for the base integrated circuit die 116 and each of the conductive columns 122.

Figure 2:
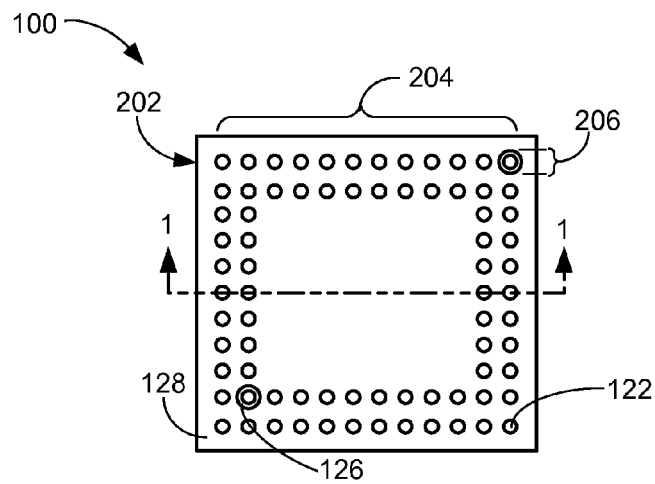
FIG. 2 is a top view of the integrated circuit packaging system of FIG. 1.

Referring now to FIG. 2, therein is shown a top view of the integrated circuit packaging system 100 of FIG. 1. The top view of the integrated circuit packaging system 100 depicts the dielectric layer 128 on a top surface 202 of the integrated circuit packaging system 100. A section line 1-1 indicates the location and direction of view of the cross-sectional view of FIG. 1.

An array 204 of the conductive columns 122 may be arranged on the top surface 202. A shield reference contact 206 may be formed at selected locations in the array 204 for attaching the conductive shield layer 126 directly to the conductive column 122. The shield reference contact 206 may be formed by patterning the dielectric layer 128 so that it does not contact selected ones of the conductive columns 122. The patterning of the dielectric layer 128 allows direct deposition of the conductive shield layer 126 on the conductive column 122.

It is understood that the array 204 of the conductive columns 122 is shown to be in pairs, but this is an example only and any number of columns or rows is possible. It is also understood that the location and number of the shield reference contact 206 is an example only and the shield reference contact 206 may be positioned in any location and in any number. The shield reference contact 206 is an optional connection and other ways to reference the conductive shield layer 126 are possible. It is further understood that the conductive shield layer 126 may be left isolated rather than tied to a reference voltage in order to control the impedance of the conductive columns 122.

Figure 3:
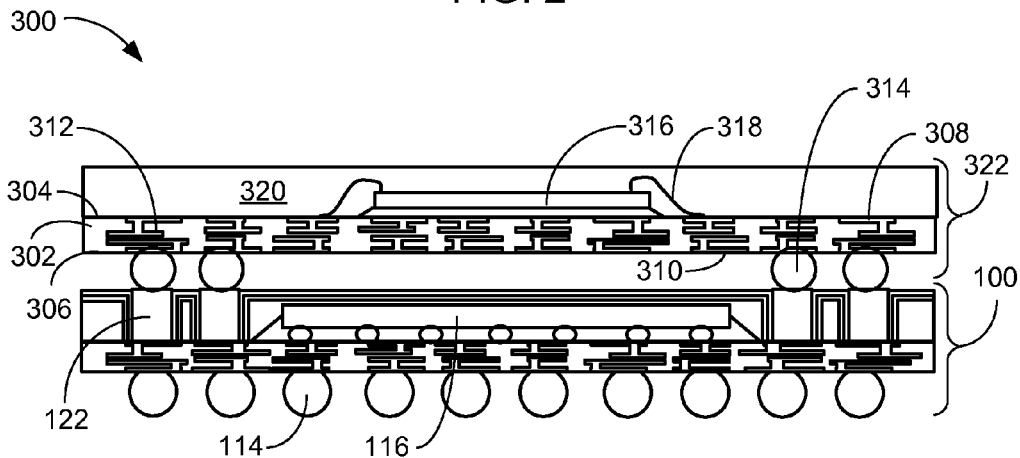
FIG. 3 is a cross-sectional view of an integrated circuit package stack utilizing the integrated circuit packaging system of FIG. 1.

Referring now to FIG. 3, therein is shown a cross-sectional view of an integrated circuit package stack 300 utilizing the integrated circuit packaging system 100 of FIG. 1. The cross-sectional view of the integrated circuit package stack 300 depicts the integrated circuit packaging system 100 as a base package in the integrated circuit package stack 300.

A stack substrate 302 having a stack component side 304 and a stack system side 306. Stack component pads 308 on the stack component side 304 may be coupled to stack system pads 310 on the stack system side 306 by stack internal wiring 312, such as traces, vias, or a combination thereof. Stacking interconnects 314, such as solder bumps, solder balls, solder columns, or stud bumps, may be formed on the stack system pads 310 in order to couple to the conductive columns 122 of the integrated circuit packaging system 100.

A stacked integrated circuit die 316 may be mounted on the stack component side 304 and coupled to the stack component pads 308 by chip interconnects 318, such as bond wires. The stacked integrated circuit die 316 may be electrically connected through the conductive columns 122 to the base integrated circuit die 116, the system interconnects 114, or a combination thereof.

A stack package body 320 may be molded on the stacked integrated circuit die 316, the chip interconnects 318, and the stack component side 304 of the stack substrate 302 for forming a stacked package 322. The stacked integrated circuit die 316 may be completely shielded from any radio frequency interference (RFI) generated by the base integrated circuit die 116. As well, any RFI generated by the stacked integrated circuit die 316 may be completely shielded from the base integrated circuit die 116.

Figure 4:
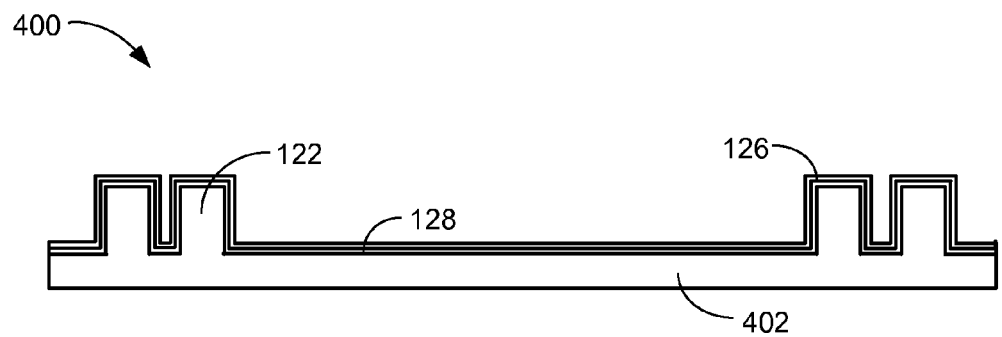
FIG. 4 is a cross-sectional view of a lead frame assembly in a shielding layer deposition phase of manufacturing.

Referring now to FIG. 4, therein is shown a cross-sectional view of a lead frame assembly 400 in a shielding layer deposition phase of manufacturing. The cross-sectional view of the lead frame assembly 400 depicts a tie bar plate 402 having the conductive columns 122 formed thereon.

The dielectric layer 128 may be patterned on the surface of the tie bar plate 402 and the conductive columns 122. The conductive shield layer 126 may be applied on the entire surface of the lead frame assembly 400.

It has been discovered that the patterning of the dielectric layer 128 may provide a connection path between the conductive shield layer 126 and the conductive columns 122 at selected locations. The conductive shield layer 126 may be formed of the same material as the conductive columns 122 or a different material.

Figure 5:
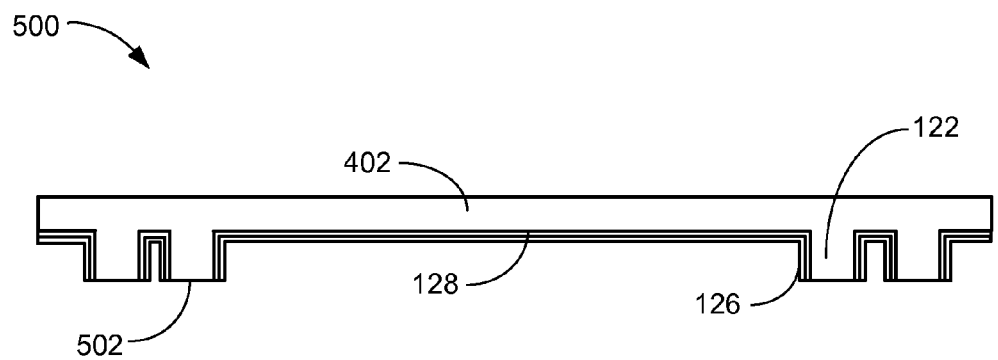
FIG. 5 is a cross-sectional view of a lead frame in a contact exposing phase of manufacturing.

Referring now to FIG. 5, therein is shown a cross-sectional view of a lead frame 500 in a contact exposing phase of manufacturing. The cross-sectional view of the lead frame 500 depicts component ends 502 ends of the conductive columns 122 having been exposed through the conductive shield layer 126 and the dielectric layer 128.

It has been discovered that the preparation of the component ends 502 may be performed by chemical etching, chemical-mechanical planarization, or a combination thereof. It is understood that the number and position of the conductive columns 122 is an example only and other configurations are possible. It is further understood that the relative thickness of the conductive columns 122, the dielectric layer 128, and the conductive shield layer 126 is an example only and other relative thicknesses are likely.

Figure 6:
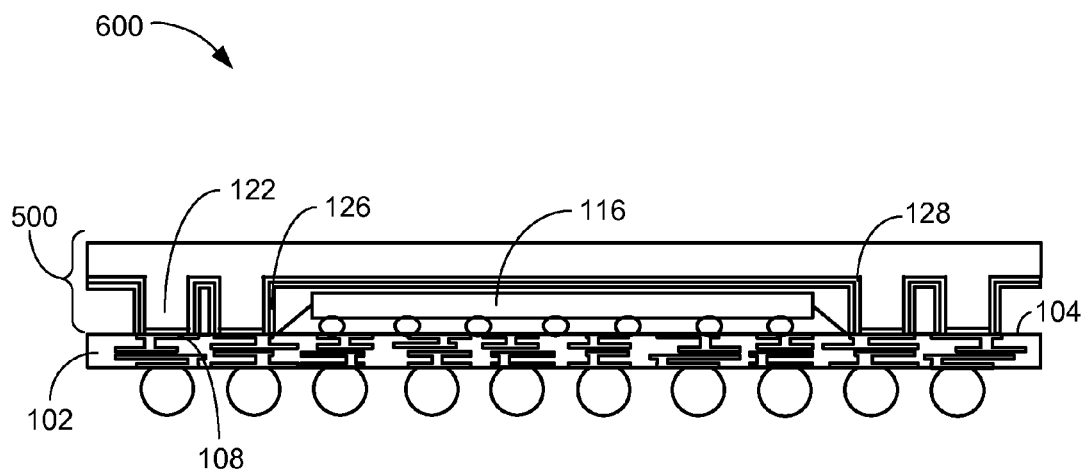
FIG. 6 is a cross-sectional view of an integrated circuit packaging assembly in a lead frame attach phase of manufacturing.

Referring now to FIG. 6, therein is shown a cross-sectional view of an integrated circuit packaging assembly 600 in a lead frame attach phase of manufacturing. The cross-sectional view of the integrated circuit packaging assembly 600 depicts the lead frame assembly 500 mounted on the component side 104 of the base package substrate 102.

The conductive shield layer 126 may have sufficient thickness to contact an inactive side of the base integrated circuit die 116 in order to act as a heat spreader as well as shielding against EMI. If the heat spreader function is not necessary to the application, a thinner layer of the conductive shield layer 126 may be applied. In which case a sufficient gap should be provided between the conductive shield layer 126 and the inactive side of the base integrated circuit die 116 for molding compound to freely flow.

An electrical connection may be formed between the conductive columns 122 and the component pads 108. The number and position of the conductive columns 122 may require a minimum thickness of the dielectric layer 128 in order to maintain a separation from the conductive shield layer 126.

Figure 7:
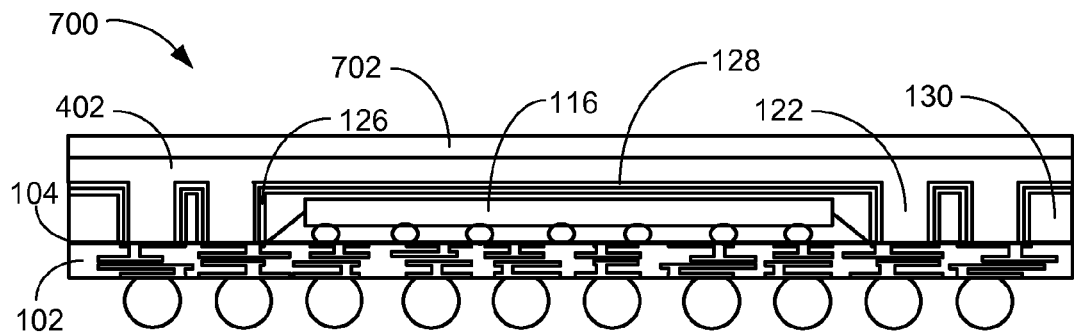
FIG. 7 is a cross-sectional view of an integrated circuit packaging assembly in a molding phase of manufacturing.

Referring now to FIG. 7, therein is shown a cross-sectional view of an integrated circuit packaging assembly 700 in a molding phase of manufacturing. The cross-sectional view of the integrated circuit packaging assembly 700 depicts the package body 130 formed by injecting the molding compound between the conductive shield layer 126 and the component side 104 of the base package substrate 102 completely filling the space around the base integrated circuit die 116.

A protective cap 702 may optionally be formed on the top of the tie bar plate 402 in order to provide improved control of package warping and provide protection during subsequent assembly and handling. The protective cap 702 may be formed in the same molding step that forms the package body 130.

The tie bar plate 402 and the protective cap 702 may be removed by chemical etching, chemical-mechanical planarization, or a combination thereof, once the package body 130 has been cured. The removal of the tie bar plate 402 and the protective cap 702 may expose the dielectric layer 128 and the conductive columns 122 to the outside environment for attaching other devices.

Figure 8:
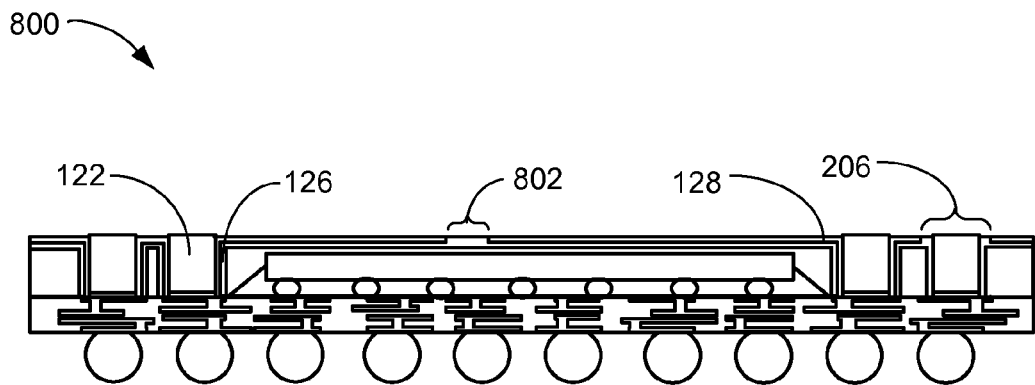
FIG. 8 is a cross-sectional view of an integrated circuit packaging system in a tie bar removal phase of manufacturing.

Referring now to FIG. 8, therein is shown a cross-sectional view of an integrated circuit packaging system 800 in a tie bar removal phase of manufacturing. The cross-sectional view of the integrated circuit packaging system 800 depicts the shield reference contact 206 formed by the patterning of the dielectric layer 128.

A shield connection pad 802 may also be formed by the patterning of the dielectric layer 128. The shield connection pad 802 may be positioned on any portion of the top surface of the integrated circuit packaging system 800.

The shield connection pad 802 may be used with or in place of the shield reference contact 206 for providing an electrical connection to a reference voltage (not shown). It is understood that the electrical connection to the conductive shield layer 126 may be provided by any number of the shield reference contact 206, the shield connection pad 802, or a combination thereof to form the conductive shield layer 126 into an electro-magnetic interference shield.

It is possible to form an array of the shield connection pad 802, which may also provide a thermal conduction path while providing an electrical connection to a reference voltage. The connection to the reference voltage may be indirectly applied through the stacking interconnects 314, of FIG. 3, coupled to the stacked package 322, of FIG. 3.

It has been discovered that the implementation of the shield reference contact 206 and the shield connection pad 802 may provide a connection point for any reference voltage that is coupled through the conductive columns 122 or through the stacking interconnects 314 to the conductive shield layer 126. The ability to attach any reference voltage may be beneficial in rejecting certain types of generated electrical noise.

Figure 9:
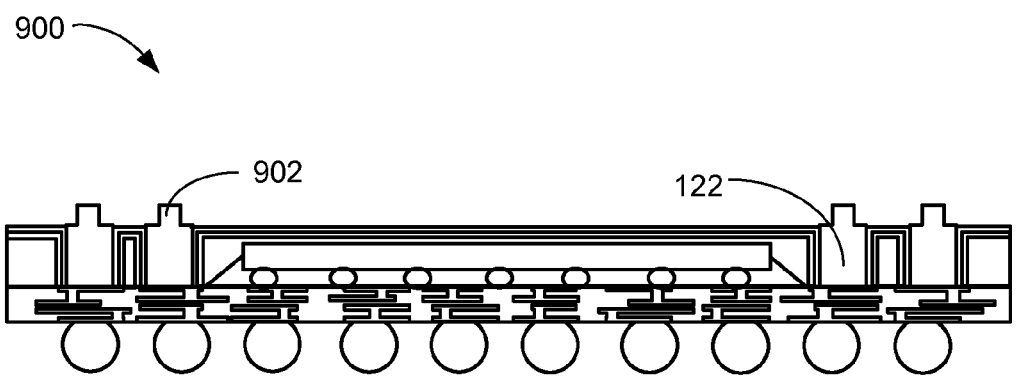
FIG. 9 is a cross-sectional view of an integrated circuit packaging system with package stacking in a second embodiment of the present invention.

Referring now to FIG. 9, therein is shown a cross-sectional view of an integrated circuit packaging system 900 with package stacking in a second embodiment of the present invention. The cross-sectional view of the integrated circuit packaging system 900 depicts a protrusion 902 on the conductive columns 122.

The protrusions may be formed by selectively etching the tie bar plate 402, of FIG. 4, in order to provide a secure attaching platform for the stack substrate 302, of FIG. 3. The shape of the protrusion 902 may be controlled by the etching process that removes the tie bar plate 402.

Thus, it has been discovered that the integrated circuit packaging system and device of the present invention furnishes important and heretofore unknown and unavailable solutions, capabilities, and functional aspects for providing a highly manufacturable and cost effective RFI shield for stacked integrated circuit packages.

Figure 10:
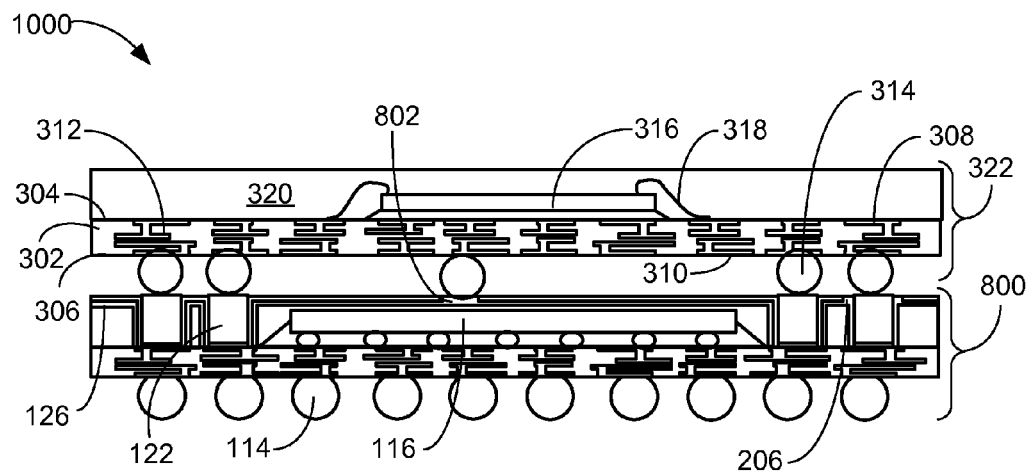
FIG. 10 is a cross-sectional view of an integrated circuit package stack utilizing the integrated circuit packaging system of FIG. 8.

Referring now to FIG. 10, therein is shown a cross-sectional view of an integrated circuit package stack 1000 utilizing the integrated circuit packaging system 800 of FIG. 8. The cross-sectional view of the integrated circuit package stack 1000 depicts the integrated circuit packaging system 800 as a base package in the integrated circuit package stack 1000.

The stack substrate 302 having the stack component side 304 and the stack system side 306. The stack component pads 308 on the stack component side 304 may be coupled to the stack system pads 310 on the stack system side 306 by the stack internal wiring 312, such as traces, vias, or a combination thereof. The stacking interconnects 314, such as solder bumps, solder balls, solder columns, or stud bumps, may be formed on the stack system pads 310 in order to couple to the conductive columns 122 of the integrated circuit packaging system 800.

The stacked integrated circuit die 316 may be mounted on the stack component side 304 and coupled to the stack component pads 308 by the chip interconnects 318, such as bond wires. The stacked integrated circuit die 316 may be electrically connected through the conductive columns 122 to the base integrated circuit die 116, the system interconnects 114, or a combination thereof.

The stack package body 320 may be molded on the stacked integrated circuit die 316, the chip interconnects 318, and the stack component side 304 of the stack substrate 302 for forming the stacked package 322. The stacked integrated circuit die 316 may be completely shielded from any radio frequency interference (RFI) generated by the base integrated circuit die 116. As well, any RFI generated by the stacked integrated circuit die 316 may be completely shielded from the base integrated circuit die 116.

The shield reference contact 206 and the shield connection pad 802 may provide a connection point for any reference voltage that is coupled through the conductive columns 122 or through the stacking interconnects 314 to the conductive shield layer 126. The ability to attach any reference voltage may be beneficial in rejecting certain types of generated electrical noise.

An electrical connection may be formed between the conductive shield layer 126 and the any reference voltage by way of the shield reference contact 206 or through the shield connection pad 802. When the shield connection pad 802 is used the connection path may include the stacking interconnects 314 coupled to the stack system pads 310 on the stack system side 306, the stack internal wiring 312, the conductive columns 122, and the system interconnects 114.

It is understood that this electrical path is for example only and other connection paths are possible. It is further understood that any number of the shield connection pad 802 may be formed on the integrated circuit packaging system 800. In one embodiment, the shield connection pad 802 may be used to form an array on the integrated circuit packaging system 800 for providing a thermal path between the stacked package 322 and the system interconnects 114.

Figure 11:
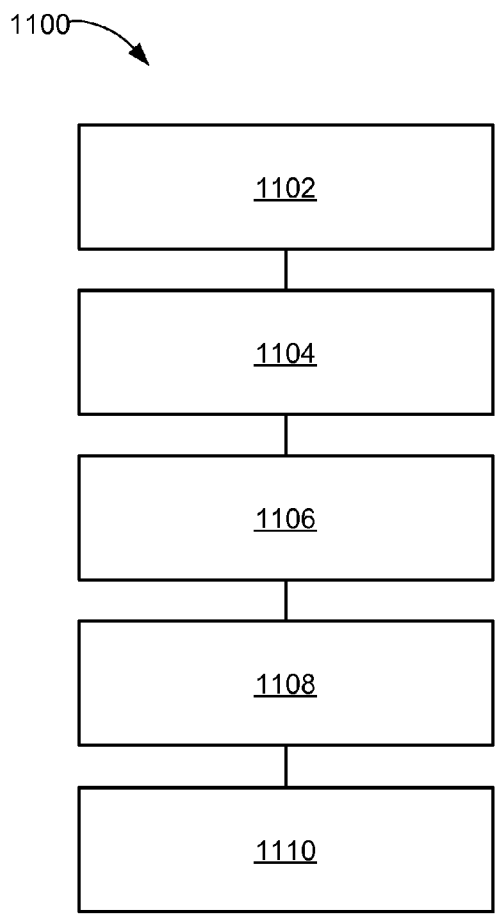
FIG. 11 is a flow chart of a method of manufacture of an integrated circuit packaging system in an embodiment of the present invention.

Referring now to FIG. 11, therein is shown a flow chart of a method 1100 of manufacture of an integrated circuit packaging system in an embodiment of the present invention. The method 1100 includes: forming a lead frame including: providing a tie bar plate, forming conductive columns on the tie bar plate, forming a dielectric layer on the conductive columns, applying a conductive shield layer on the dielectric layer, and exposing the conductive columns through the dielectric layer and the conductive shield layer in a block 1102; forming a base package substrate in a block 1104; mounting a base integrated circuit die on the base package substrate in a block 1106; mounting the tie bar plate, over the base integrated circuit die, conductively coupled to the base package substrate to form the conductive shield layer into an electro-magnetic interference shield in a block 1108; and removing the tie bar plate to expose the conductive columns from the dielectric layer in a block 1110.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package-on-package integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    a base package substrate;
    a base integrated circuit die coupled to the base package substrate;
    an electro-magnetic interference shield provided by a conductive shield layer over the base integrated circuit die; and
    an array of conductive columns coupled to the base package substrate and exposed through the electro-magnetic interference shield with a non-horizontal portion of the electro-magnetic interference shield between the base integrated circuit die and the conductive columns.

2. The system as claimed in claim 1 further comprising a stacked package coupled to the array of the conductive columns and over the electro-magnetic interference shield.

3. The system as claimed in claim 1 further comprising a shield reference contact in the array, a shield connection pad on the electro-magnetic interference shield, or a combination thereof.

4. The system as claimed in claim 1 further comprising protrusions on the conductive columns extending above the electro-magnetic interference shield.

5. The system as claimed in claim 1 further comprising an epoxy molding compound between the electro-magnetic interference shield and the base package substrate.

6. The system as claimed in claim 1 further comprising:
component pads coupled to system pads by internal circuitry in the base package substrate;
chip interconnects coupled between the base integrated circuit die and the component pads; and
a dielectric layer on the conductive columns and over the base integrated circuit die.

7. The system as claimed in claim 6 further comprising a stacked package having a stacked integrated circuit die coupled to the conductive columns and over the electro-magnetic interference shield, with the stacked integrated circuit die coupled to the base integrated circuit die.

8. The system as claimed in claim 6 further comprising a shield reference contact in the array, a shield connection pad on the electro-magnetic interference shield, or a combination thereof having the conductive shield layer coupled to one or more of the conductive columns through the dielectric layer.

9. The system as claimed in claim 6 further comprising:
protrusions on the conductive columns extending above the electro-magnetic interference shield; and
stacked package having stacking interconnects coupled to the protrusions.

10. The system as claimed in claim 6 further comprising a package body between the electro-magnetic interference shield and the base package substrate, with the package body formed by an epoxy molding compound.

11. A method of manufacture of an integrated circuit packaging system comprising:
forming a lead frame including:
providing a tie bar plate,
forming conductive columns on the tie bar plate,
forming a dielectric layer on the conductive columns,
applying a conductive shield layer on the dielectric layer, and
exposing the conductive columns through the dielectric layer and the conductive shield layer;
forming a base package substrate;
mounting a base integrated circuit die on the base package substrate;
providing an electro-magnetic interference shield from the conductive shield layer by mounting the tie bar plate over the base integrated circuit die with a non-horizontal portion of the electro-magnetic interference shield between the base integrated circuit die and the conductive columns; and
removing the tie bar plate to expose the conductive columns from the dielectric layer.

12. The method as claimed in claim 11 further comprising coupling a stacked package to the conductive columns and over the electro-magnetic interference shield.

13. The method as claimed in claim 11 further comprising forming a shield reference contact, a shield connection pad, or a combination thereof on the lead frame by patterning the dielectric layer.

14. The method as claimed in claim 11 further comprising forming protrusions on the conductive columns extending above the electro-magnetic interference shield.

15. The method as claimed in claim 11 further comprising injecting an epoxy molding compound between the lead frame and the base package substrate.

16. A method of manufacture of an integrated circuit packaging system comprising:
forming a lead frame including:
providing a tie bar plate,
forming conductive columns on the tie bar plate,
forming a dielectric layer on the conductive columns and the tie bar plate,
applying a conductive shield layer on the dielectric layer, and
exposing the conductive columns through the dielectric layer and the conductive shield layer;
forming a base package substrate having component pads coupled to system pads through internal circuitry;
mounting a base integrated circuit die on the base package substrate including coupling chip interconnects between the base integrated circuit die and the component pads;
providing an electro-magnetic interference shield from the conductive shield layer by mounting the tie bar plate over the base integrated circuit die with a non-horizontal portion of the electro-magnetic interference shield between the base integrated circuit die and the conductive columns; and
removing the tie bar plate for exposing the conductive columns from the dielectric layer including applying a reference voltage to the conductive shield layer through the conductive columns.

17. The method as claimed in claim 16 further comprising coupling a stacked package having a stacked integrated circuit die to the conductive columns and over the electro-magnetic interference shield with the stacked integrated circuit die coupled to the base integrated circuit die.

18. The method as claimed in claim 16 further comprising forming a shield reference contact, a shield connection pad, or a combination thereof on the lead frame by patterning the dielectric layer to couple the conductive shield layer to one or more of the conductive columns.

19. The method as claimed in claim 16 further comprising:
forming protrusions on the conductive columns extending above the electro-magnetic interference shield; and
coupling a stacked package having stacking interconnects on the protrusions.

20. The method as claimed in claim 16 further comprising injecting an epoxy molding compound to form a package body between the base package substrate and the conductive shield layer and over the tie bar plate.

* * * * *

UNITED STATES PATENT AND TRADEMARK OFFICE
CERTIFICATE OF CORRECTION

PATENT NO. : 8,288,844 B2  
APPLICATION NO. : 12/641319  
DATED : October 16, 2012  
INVENTOR(S) : Huang et al.

Page 1 of 1

It is certified that error appears in the above-identified patent and that said Letters Patent is hereby corrected as shown below:

Column 9:

line 27, delete "stacked package having stacking" and insert therefor --a stacked package having stacking--

Signed and Sealed this  
Twelfth Day of February, 2013

Teresa Stanek Rea  
*Acting Director of the United States Patent and Trademark Office*